United States Patent
Kannery et al.

(10) Patent No.: US 11,029,864 B2
(45) Date of Patent: Jun. 8, 2021

(54) METHOD AND SYSTEM FOR DYNAMIC BACKUP POLICY HANDSHAKING

(71) Applicant: EMC IP Holding Company LLC, Hopkinton, MA (US)

(72) Inventors: Supriya Kannery, Bangalore (IN); Rahul Deo Vishwakarma, Bangalore (IN)

(73) Assignee: EMC IP Holding Company LLC, Hopkinton, MA (US)

(*) Notice: Subject to any disclaimer, the term of this patent is extended or adjusted under 35 U.S.C. 154(b) by 343 days.

(21) Appl. No.: 16/261,815

(22) Filed: Jan. 30, 2019

(65) Prior Publication Data

US 2020/0241773 A1 Jul. 30, 2020

(51) Int. Cl.
*G06F 3/06* (2006.01)
*G06F 30/20* (2020.01)

(52) U.S. Cl.
CPC ............ *G06F 3/0631* (2013.01); *G06F 3/067* (2013.01); *G06F 3/0619* (2013.01); *G06F 3/0653* (2013.01); *G06F 30/20* (2020.01)

(58) Field of Classification Search
CPC ........ G06F 3/0631; G06F 3/0619; G06F 3/06; G06F 3/0653; G06F 3/0658; G06F 3/0671; G06F 3/065; G06F 3/0608; G06F 30/20

See application file for complete search history.

(56) References Cited

U.S. PATENT DOCUMENTS

| | | | | |
|---|---|---|---|---|
| 8,688,927 | B1* | 4/2014 | Chamness | G06F 11/1451 711/154 |
| 9,104,971 | B1* | 8/2015 | Chamness | G06Q 30/02 |
| 9,798,629 | B1* | 10/2017 | Shilane | G06F 11/1464 |
| 10,146,469 | B2* | 12/2018 | Polkovnikov | G06F 3/0611 |
| 2006/0047576 | A1* | 3/2006 | Aaltonen | G06Q 30/0631 705/26.43 |
| 2015/0286507 | A1* | 10/2015 | Elmroth | G06F 9/5061 718/104 |
| 2015/0293815 | A1* | 10/2015 | Harel | G06F 11/3034 707/649 |
| 2016/0378405 | A1* | 12/2016 | Resch | G06F 3/0604 711/114 |
| 2019/0324652 | A1 | 10/2019 | Vishwakarma | |
| 2019/0332486 | A1* | 10/2019 | Aseev | G06F 16/182 |
| 2021/0056386 | A1* | 2/2021 | Murugesan | G06N 3/08 |

\* cited by examiner

*Primary Examiner* — Ramon A. Mercado
(74) *Attorney, Agent, or Firm* — Chamberlain, Hrdlicka, White, Williams & Aughtry

(57) ABSTRACT

A method and system for dynamic backup policy handshaking. Specifically, the method and system disclosed herein entail optimizing storage space utilization for backup, archiving, and/or disaster recovery-purposed data storage. That is, based on time projections until the data storage reaches capacity, the utilization of the remaining storage space may be optimized without compromising data protection in order to prolong the use of the data storage. In prolonging the utilization of the data storage, tiered data backup policies may be adjusted.

20 Claims, 13 Drawing Sheets

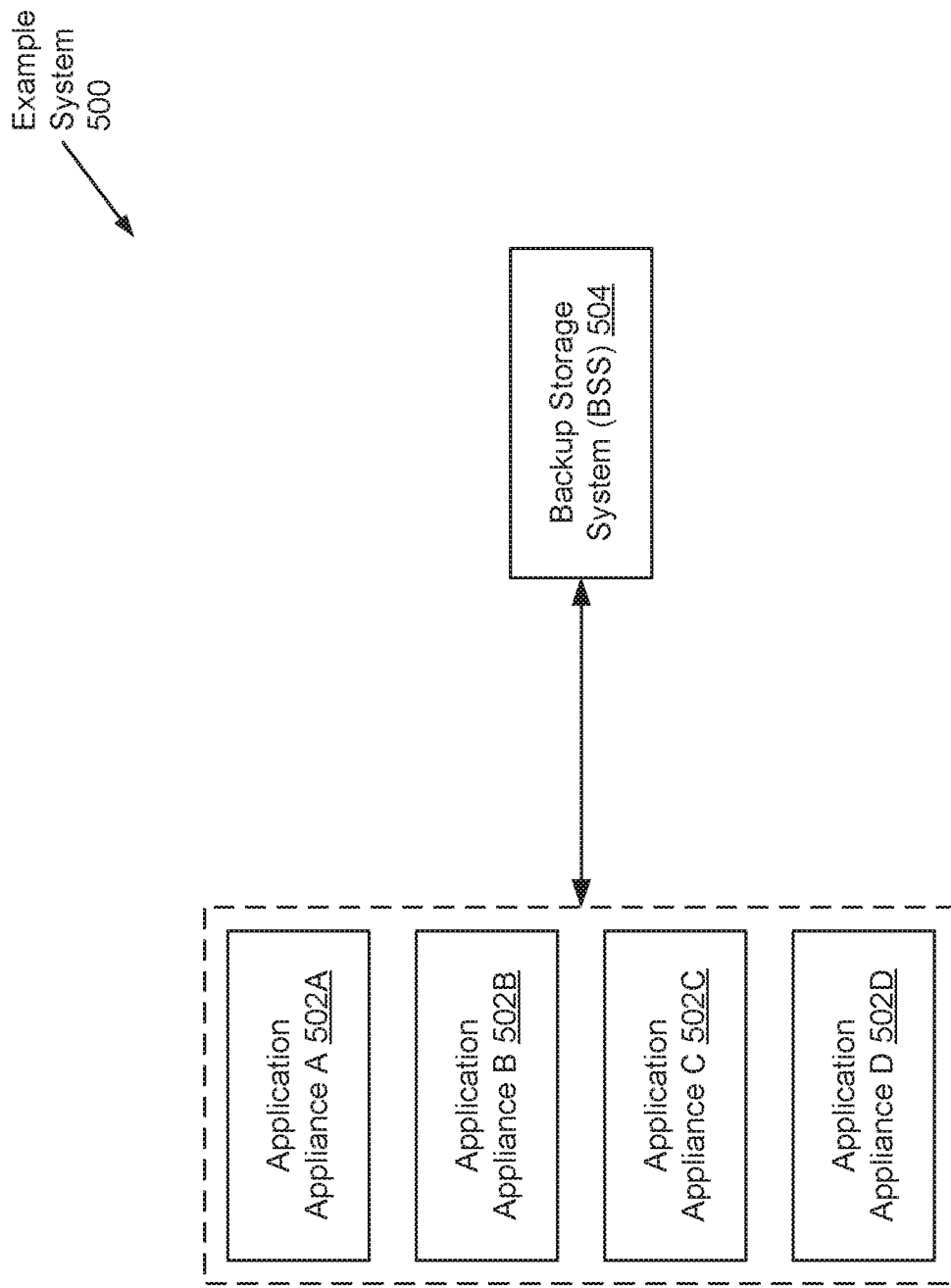

METHOD AND SYSTEM FOR DYNAMIC BACKUP POLICY HANDSHAKING

BACKGROUND

Storage capacity projections present storage system administrators with useful information directed to storage space usage and depletion. Administrators, relying on these projections, in turn may take steps to optimize and/or prolong the utilization of the storage space; however, currently, said steps may be performed manually.

BRIEF DESCRIPTION OF DRAWINGS

FIGS. 5A-5F show an example scenario in accordance with one or more embodiments of the invention.

DETAILED DESCRIPTION

Specific embodiments of the invention will now be described in detail with reference to the accompanying figures. In the following detailed description of the embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In the following description of FIGS. 1-5F, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to necessarily imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and a first element may encompass more than one element and succeed (or precede) the second element in an ordering of elements.

In general, embodiments of the invention relate a method and system for dynamic backup policy handshaking Specifically, one or more embodiments of the invention entail optimizing storage space utilization for backup, archiving, and/or disaster recovery-purposed data storage. That is, based on time projections until the data storage reaches capacity, the utilization of the remaining storage space may be optimized without compromising data protection in order to prolong the use of the data storage. In prolonging the utilization of the data storage, tiered data backup policies may be adjusted.

Figure 1:
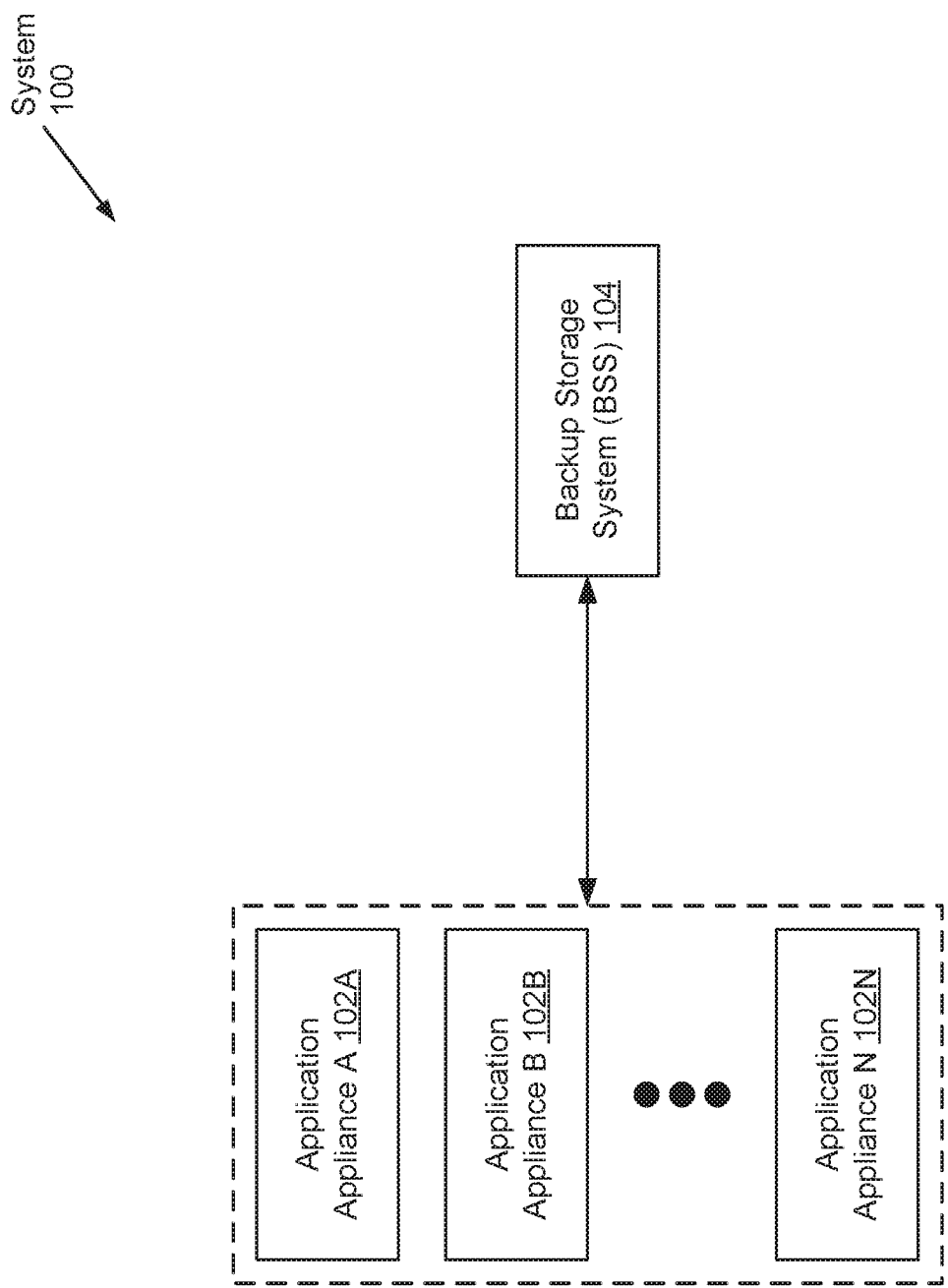
FIG. 1 shows a system in accordance with one or more embodiments of the invention.

FIG. 1 shows a system in accordance with one or more embodiments of the invention. The system (100) may include a set of application appliances (102A-102N), each operatively connected to a backup storage system (BSS) (104). Each of these components is described below.

In one embodiment of the invention, each of the application appliances (102A-102N) may be directly or indirectly connected to the BSS (104) through a network (not shown) (e.g., a local area network (LAN), a wide area network (WAN) such as the Internet, a mobile network, etc.). The network may be implemented using any combination of wired and/or wireless connections. In embodiments in which one or more application appliances (102A-102N) and the BSS (104) are indirectly connected, there may be other networking components or systems (e.g., switches, routers, gateways, etc.) that may facilitate communications, information exchange, and/or resource sharing. Further, any of the above-mentioned components may communicate with one another using any combination of wired and/or wireless communication protocols.

In one embodiment of the invention, each application appliance (102A-102N) may represent any physical computing system whereon one or more software applications (not shown) may be executing. These software applications may, for example, implement large-scale and complex data processing; and may service multiple users concurrently. Further, each application appliance (102A-102N) may provide and manage the allocation of various computing resources (e.g., computer processors, memory, persistent and non-persistent storage, network bandwidth, etc.) towards the execution of various processes (or tasks) that may be instantiated thereon. One of ordinary skill will appreciate that each application appliance (102A-102N) may perform other functionalities without departing from the scope of the invention. Examples of an application appliance (102A-102N) may include, but are not limited to, a desktop computer, a laptop computer, a tablet computer, a server, a mainframe, a smartphone, or any other computing system similar to the exemplary computing system shown in FIG. 4. Application appliances (102A-102N) are described in further detail below with respect to FIG. 2A.

In one embodiment of the invention, the BSS (104) may represent a data backup, archiving, and/or disaster recovery storage system. The BSS (104) may be implemented using one or more servers (not shown). Each server may be a physical server (i.e., which may reside in a data center) or a virtual server (i.e., which may reside in a cloud computing environment). In one embodiment of the invention, the BSS (104) may be implemented using one or more computing systems similar to the exemplary computing system shown in FIG. 4. The BSS (104) is described in further detail below with respect to FIG. 2C.

While FIG. 1 shows a configuration of components, other system configurations may be used without departing from the scope of the invention. For example, in one embodiment of the invention, the system (100) may further include a secondary BSS (not shown) that may operatively connect to the BSS (104). In such an embodiment, the secondary BSS may represent another backup, archiving, and/or disaster recovery storage system whereon staler or less significant backup copies of application appliance (102A-102N) pertinent data may alternatively be stored, in order to optimized storage space on the BSS (104). By way of another example, in another embodiment of the invention, the system (100) may additionally or alternatively include a vendor order management system (OMS) (not shown) that may operatively connect to the BSS (104). In such an embodiment, the vender OMS may receive and process procurement requests, which may be submitted by the BSS (104) as a measure to optimize storage space on the BSS (104). The procurement request may pertain to the acquisition of: (a) additional physical storage devices and/or media, should the BSS (104) be implemented in a data center; (b) additional virtual storage space, should the BSS (104) be implemented in a cloud computing environment; or (c) a combination thereof.

Figure 2A:
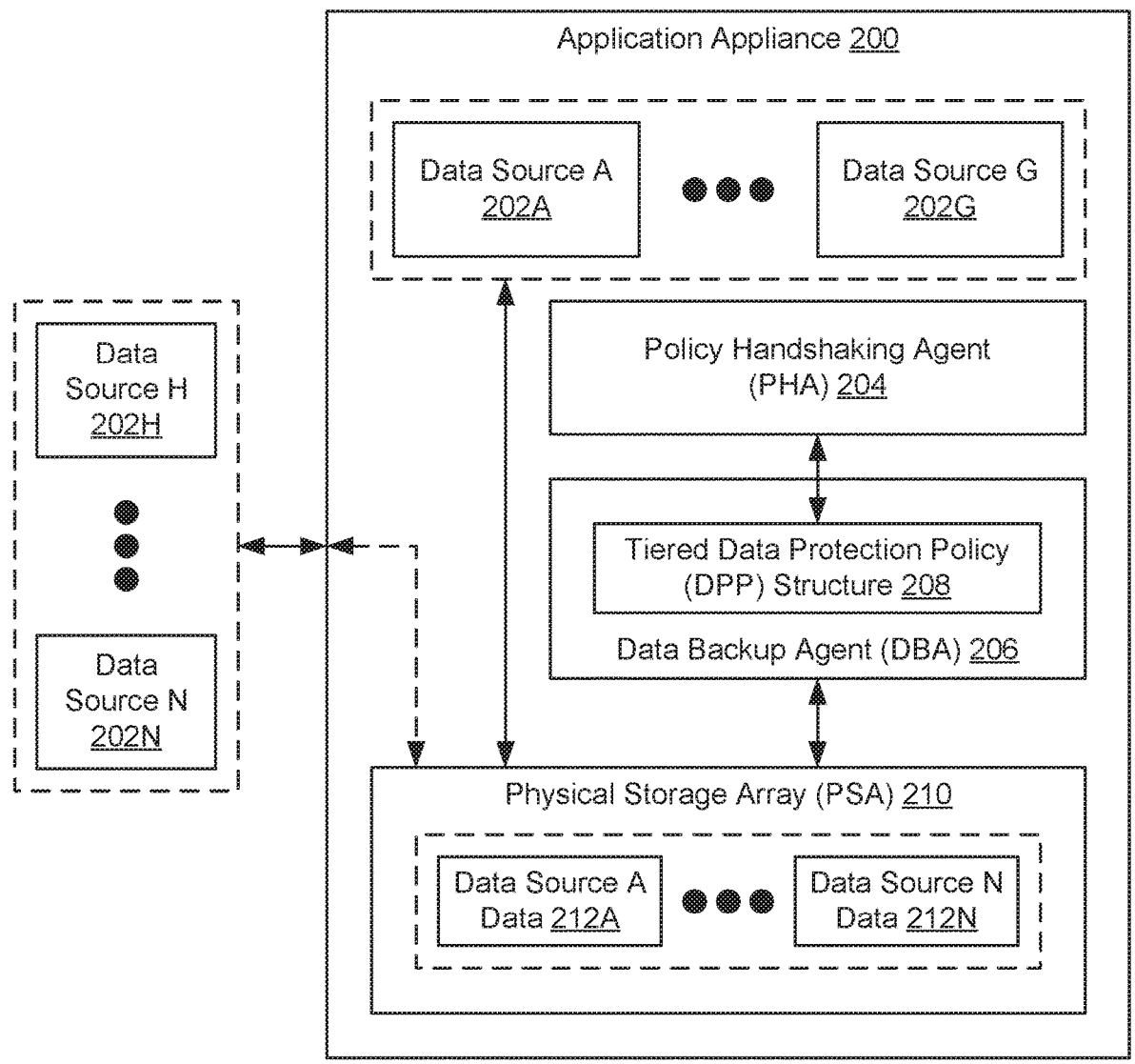
FIG. 2A shows an application appliance in accordance with one or more embodiments of the invention.

FIG. 2A shows an application appliance in accordance with one or more embodiments of the invention. As described above, each application appliance (200) may represent any physical computing system. Further, each application appliance (200) may include one or more internal data sources (202A-202G), a policy handshaking agent (PHA) (204), a data backup agent (DBA) (206), and a physical storage array (PSA) (210). Each of these subcomponents is described below.

In one embodiment of the invention, an internal data source (202A-202G) may represent hardware, software, or a combination thereof, residing and/or executing within the application appliance (200), wherefrom data may be sourced. Further, an internal data source (202A-202G) may include functionality to: read, retrieve, or otherwise obtain data from the PSA (210), one or more other internal data sources (202A-202G), and/or one or more external data sources (202H-202N) (described below); derive, infer, or otherwise generate data, which may or may not rely on obtained data; and/or consume at least a portion of the PSA (210) to store obtained and/or generated data thereon. By way of examples, an internal data source (202A-202G) may include, but is not limited to, a software application, a virtual machine, an in-memory and/or local disk based database, an internal sensor, an input device (e.g., keyboard, mouse, touchscreen, camera, microphone, etc.), a locally implemented graphic user interface (GUI) or command line interface (CLI), etc.

In one embodiment of the invention, the PHA (204) may be a computer program or process (i.e., an instance of a computer program) that executes on the underlying hardware of the application appliance (200). Specifically, the PHA (204) may be a computer program or process tasked with facilitating dynamic backup policy handshaking with a complimentary PHA (not shown) executing on the backup storage system (BSS) (see e.g., FIG. 1). To that extent, the PHA (204) may include functionality to: receive change policy messages (described below) from the BSS; update or refrain from updating a tiered data protection policy (DPP) structure (208) (described below) in response to receiving the change policy messages; issue change policy responses back to the BSS, which may outline the action(s) taken with respect to the tiered DPP structure (208); receive revert policy messages from the BSS; and return the tiered DPP structure (208) to prior states, if applicable, in response to receiving the revert policy messages. One of ordinary skill will appreciate that the PHA (204) may perform other functionalities without departing from the scope of the invention.

In one embodiment of the invention, the DBA (206) may be a computer program or process (i.e., an instance of a computer program) that executes on the underlying hardware of the application appliance (200). Specifically, the DBA (206) may be a computer program or process tasked with managing data backup and recovery operations involving information consolidated locally on the PSA (210)—e.g., data source data (212A-212N) (described below). To that extent, the DBA (206) may include functionality (at least during data backup operations) to: select or identify locally consolidated information (LCI) to back up; replicate the selected/identified LCI, to obtain backup copies of the selected/identified LCI; and transmit the backup copies of the selected/identified LCI to the backup storage system (BSS) (see e.g., FIG. 1) for remote consolidation. Further the DBA (206) may include functionality (at least during data recovery operations) to: receive backup copies of selected/identified LCI from the BSS, which may have been transmitted thereto for remote consolidation prior to the trigger for the data recovery; and restore the received backup copies of the selected/identified LCI onto the PSA (210). One of ordinary skill will appreciate that the DBA (206) may perform other functionalities without departing from the scope of the invention.

In one embodiment of the invention, the DBA (206) may perform the above-mentioned data backup and recovery functionalities based at least on one or more data protection policies (DPP), which may be organized in a tiered DPP structure (208). The tiered DPP structure (208) may represent a data structure that tracks the assignment of different data sources (e.g., internal data sources (202A-202G) and/or external data sources (202H-202N) (described below)) to levels or classes of data protection. The tiered DPP structure is described in further detail below with respect to FIG. 2B.

In one embodiment of the invention, the PSA (210) may represent a collection of one or more physical storage devices and/or media on which various forms of information—e.g., data source data (212A-212N) (described below)—may be consolidated. The one or more physical storage devices and/or media may or may not be of the same type. Further, the information consolidated in the PSA (210) may be arranged by way of any storage mechanism (e.g., a filesystem, a collection of tables or records, etc.). In one embodiment of the invention, the PSA (210) may be implemented using persistent (i.e., non-volatile) storage. Examples of persistent storage may include, but are not limited to: optical storage, magnetic storage, NAND Flash Memory, NOR Flash Memory, Magnetic Random Access Memory (M-RAM), Spin Torque Magnetic RAM (ST-MRAM), Phase Change Memory (PCM), or any other storage defined as non-volatile Storage Class Memory (SCM).

In one embodiment of the invention, the PSA (210) may store various data source data (212A-212N). Each data source data (212A-212N) may refer to a logical container within, or a logical partition of, the PSA (210) wherein information pertinent to a respective internal data source (202A-202G) or external data source (202H-202N) (described below) may reside. Further, pertinent information for any given data source (202A-202N) may encompass a collection of data objects (e.g., state files, metadata, configuration settings, etc.) that may have been generated as a result, used to program the behavior, or otherwise interpreted in the performance, of one or more functionalities of the given data source (202A-202N). Moreover, each data source data (212A-212N) may span across one or more physical storage devices and/or media that, at least in part, implement the PSA (210).

In one embodiment of the invention, each application appliance (200) may operatively connect with zero or more external data sources (202H-202N). An external data source (202H-202N) may represent hardware, software, or a combination thereof, residing and/or executing outside the application appliance (200), wherefrom data may be sourced. An external data source (202H-202N) may alternatively reside and/or execute, for example, on physical portable devices (e.g., external hard devices, flash-based memory drives, etc.) or physical remote and/or cloud-computing based computing systems, which may operatively connected to an application appliance (200) directly through a wired medium or indirectly through a network, respectively. Further, an external data source (202H-202N) may include functionality to: read, retrieve, or otherwise obtain data from the PSA (210), one or more internal data sources (202A-202G), and/or one or more other external data sources (202H-202N); derive, infer, or otherwise generate data, which may or may not rely on obtained data; and/or consume at least a portion of the PSA (210) to store obtained and/or generated data thereon. By way of examples, an external data source (202H-202N) may include, but is not limited to, a software application, a could service, a virtual machine, a remote database or file server, an external sensor, a feed data stream, a web-based or remotely implemented graphical user interface (GUI) or command line interface (CLI), etc.

Figure 2B:
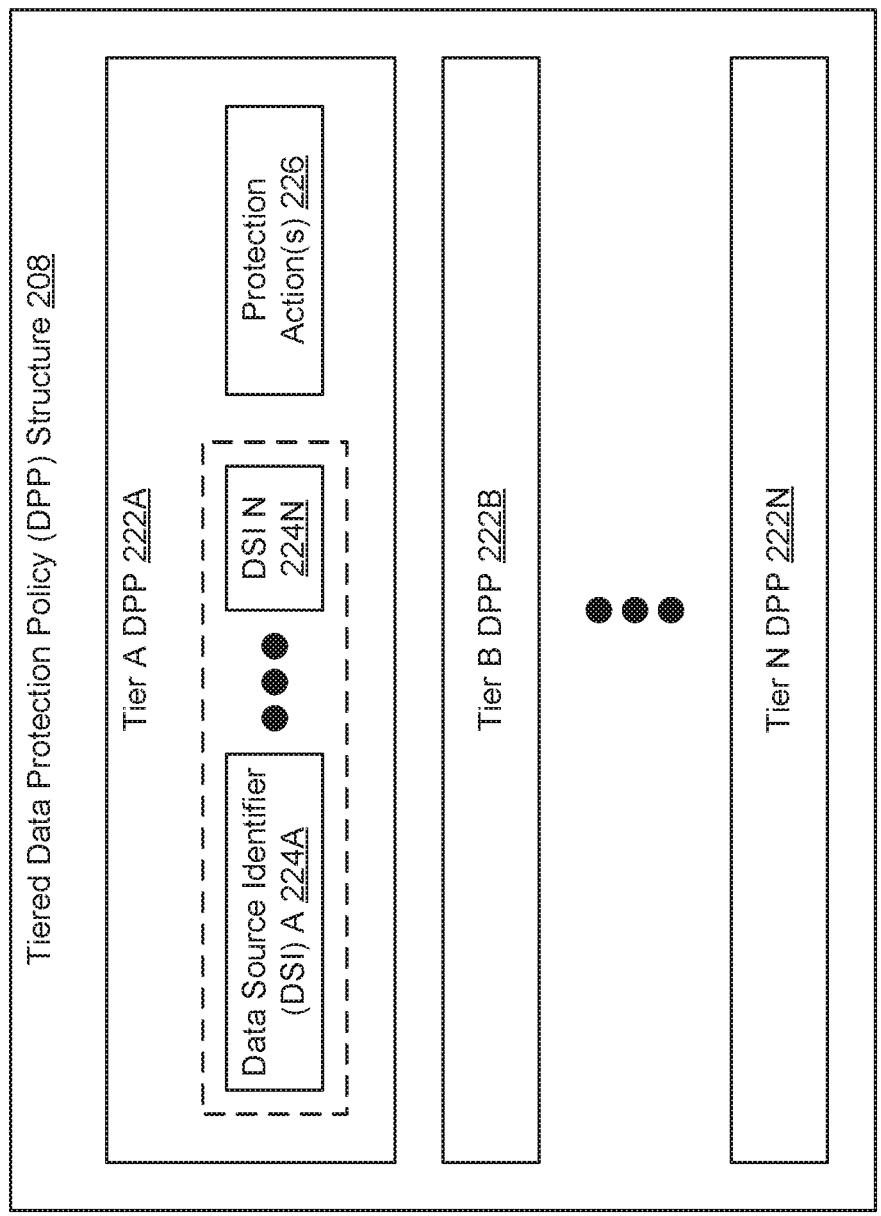
FIG. 2B shows a tiered data protection policy structure in accordance with one or more embodiments of the invention.

FIG. 2B shows a tiered data protection policy (DPP) structure in accordance with one or more embodiments of the invention. As briefly mentioned above, the tiered DPP structure (208) may represent a data structure that tracks the assignment of data sources (e.g., internal data sources within, and/or external data sources operatively connected to, any given application appliance (see e.g., FIG. 2A)) to levels (or classes) of data protection. That is, the tiered DPP structure (208) may organize data sources in a hierarchy in accordance with the degree of importance, regarding the preservation of their associated data (e.g., data source data) holds, to the users of the application appliance (not shown).

In one embodiment of the invention, each data source (not shown), identified by a respective data source identifier (DSI) (224A-224N), may be assigned to one of one or more tiers (222A-222N). Any given DSI (224A-224N) may refer to a string of characters (e.g., letters, numbers, symbols, etc.), extending any arbitrary length, that may uniquely identify a respective data source. By way of examples, the DSI (224A-224N) may be represented through an alphanumeric string, or a N-bit integer (where N>0) expressed in hexadecimal notation.

In one embodiment of the invention, the tier(s) (222A-222N) may each pertain to a different data protection service level supported by the data backup agent (DBA) (see e.g., FIG. 2A) on an application appliance. Further, the tier(s) (222A-222N) may be ranked—through a descending rank precious metals (e.g., platinum, gold, silver, etc.) convention, an ascending rank numbering (e.g., 1, 2, 3, etc.) convention, or any other convention—based on the degree of the data protection service used to preserve data associated with data sources assigned thereto. In one embodiment of the invention, each successively higher ranked tier (222A-222N) may provide better data preservation protection than the tier (222A-222N) ranked directly below it in the hierarchy. By this standard, the highest ranked tier (222A-222N) may provide the best class of data protection for data source data associated with data sources assigned thereto, whereas the lowest ranked tier (222A-222N) may provide a minimum threshold of data protection for data source data associated with data sources assigned thereto.

In one embodiment of the invention, the class of data protection associated with any given tier (222A-222N) may be implemented through one or more protection actions (226). Each protection action (226) may refer to an instruction regarding, for example, how often assigned data source data (associated with assigned data sources) should be replicated and backed-up, what type of backup (e.g., full, incremental, transactional, etc.) should be applied to preserve the data source data, how long should the backed-up data source data be retained, what storage medium should the backed-up data source data be stored in, should deduplication be applied, and/or other backup-pertinent considerations. Accordingly, by way of example, higher ranked data protection tiers (222A-222N) may specify protection actions (226) synonymous with higher backup periodicities (e.g., daily versus monthly), faster storage medium options (e.g., solid state drives versus tape), longer retention periods (e.g., years versus weeks), etc. Furthermore, with the tendency of being protected more often, retained longer, accessed more frequently, etc., data source data, pertaining to data sources assigned to higher data protection tiers (222A-222N), tend to consume more storage space on the backup storage system (BSS) than data source data pertaining to data sources assigned to lower data protection tiers (222A-222N).

Figure 2C:
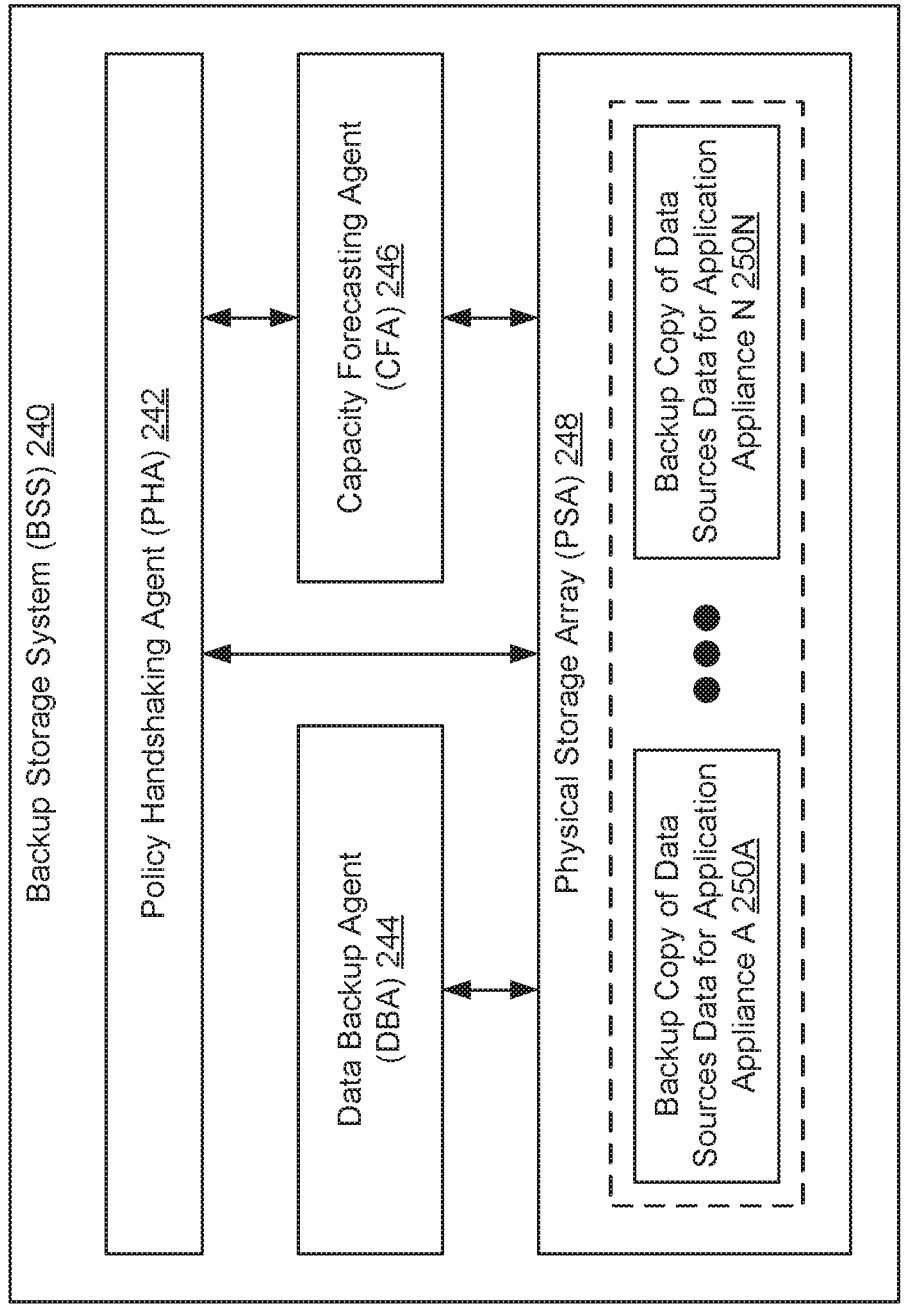
FIG. 2C shows a backup storage system in accordance with one or more embodiments of the invention.

FIG. 2C shows a backup storage system (BSS) in accordance with one or more embodiments of the invention. As described above, the BSS (240) may represent a data backup, archiving, and/or disaster recovery storage system. Further, the BSS (240) may include a policy handshaking agent (PHA) (242), a data backup agent (DBA) (244), a capacity forecasting agent (CFA) (246), and a physical storage array (PSA) (248). Each of these subcomponents is described below.

In one embodiment of the invention, the PHA (242) may be a computer program or process (i.e., an instance of a computer program) that executes on the underlying hardware of the BSS (240). Specifically, the PHA (242) may be a computer program or process tasked with facilitating dynamic backup policy handshaking with a complimentary PHA (not shown) executing on one or more application appliances (see e.g., FIG. 2A). To that extent, the PHA (242) may include functionality to perform the various steps substantively outlined below with respect to FIGS. 3A and 3B.

In one embodiment of the invention, the DBA (244) may be a computer program or process (i.e., an instance of a computer program) that executes on the underlying hardware of the BSS (240). Specifically, the DBA (244) may be a computer program or process tasked with managing data backup and recovery operations involving backup copies of information consolidated on the PSA (248)—e.g., backup copies of data source data (250A-250N) for one or more application appliances (not shown). To that extent, the DBA (244) may include functionality (at least during data backup operations) to: receive backup copies of data source data (250A-250N) from one or more application appliances; and store the received backup copies of data source data (250A-250N) in the PSA (248). Further, the DBA (244) may include functionality (at least during data recovery operations) to: receive requests from one or more application appliances, where each request identifies a particular backup copy of data source data (250A-250N); retrieve the particular backup copy/copies of data source data (250A-250N) identified in the received requests; and transmit the retrieved backup copy/copies of data source data (250A-250N) to the appropriate appliance appliance(s), where the retrieved backup copy/copies of data source data (250A-250N) may be restored thereon. One of ordinary skill will appreciate that the DBA (244) may perform other functionalities without departing from the scope of the invention.

In one embodiment of the invention, the CFA (246) may be a computer program or process (i.e., an instance of a computer program) that executes on the underlying hardware of the BSS (240). Specifically, the CFA (246) may be a computer program or process tasked with determining or estimating lengths of time remaining until all of the available storage space in the PSA (248) is consumed—i.e., lengths of time until full storage space capacity is reached. Further, the CFA (246) may employ one or more forecasting and/or predictive analysis techniques, which may rely on various storage space pertinent factors (e.g., storage consumption rate, etc.), in order to generate these time to full capacity projections (TFCPs). By way of an example, the CFA (246) may apply a higher-order fuzzy time series (HOFTS) predictive analysis algorithm to estimate the remaining depletion time pertaining to available storage space in the PSA (248). The HOFTS predictive analysis algorithm is described in further detail in U.S. application Ser. No. 15/960,665, filed on Apr. 24, 2018, which is incorporated herein by reference in entirety. Moreover, the CFA (248) may generate the projection(s) on-demand upon receiving requests from the PHA (242).

In one embodiment of the invention, the PSA (248) may represent a collection of one or more physical storage devices and/or media on which various forms of information—e.g., backup copies of data source data (250A-250N) (described below)—may be consolidated. The one or more physical storage devices and/or media may or may not be of the same type. Further, the information consolidated in the PSA (248) may be arranged by way of any storage mechanism (e.g., a filesystem, a collection of tables or records, etc.). In one embodiment of the invention, the PSA (248) may be implemented using persistent (i.e., non-volatile) storage. Examples of persistent storage may include, but are not limited to: optical storage, magnetic storage, NAND Flash Memory, NOR Flash Memory, Magnetic Random Access Memory (M-RAM), Spin Torque Magnetic RAM (ST-MRAM), Phase Change Memory (PCM), or any other storage defined as non-volatile Storage Class Memory (SCM).

In one embodiment of the invention, the PSA (248) may store various backup copies of data source data (250A-250N). Each backup copy of data source data (250A-250N) may refer to a logical container within, or a logical partition of, the PSA (248) wherein replicated information pertinent to a given application appliance (see e.g., FIGS. 1 and 2A) may reside. Further, any replicated pertinent information for a given application appliance may encompass a collection of data objects (e.g., state files, metadata, configuration settings, etc.) that may have been generated as a result, used to program the behavior, or otherwise interpreted in the performance, of one or more functionalities of the given application appliance and/or the various data sources within or operatively connected to the given application appliance. Moreover, each backup copy of data source data (250A-250N) may span across one or more physical storage devices and/or media that, at least in part, implement the PSA (248).

Figure 3A:
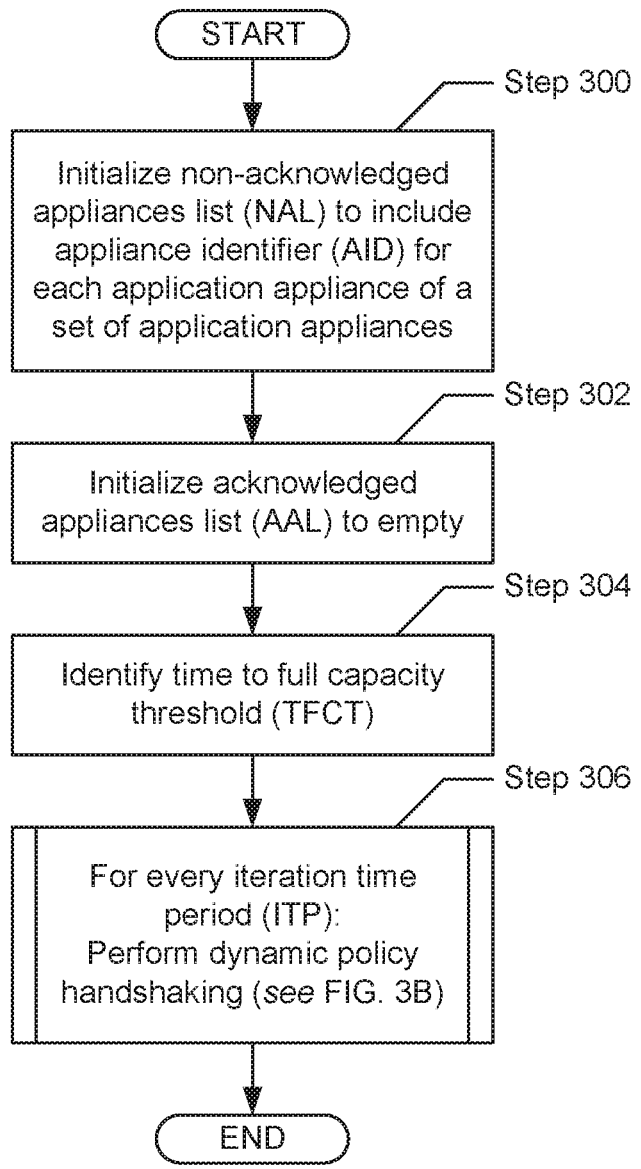
FIGS. 3A and 3B show flowcharts describing a method for optimizing backup storage space utilization in accordance with one or more embodiments of the invention.
Figure 3B:
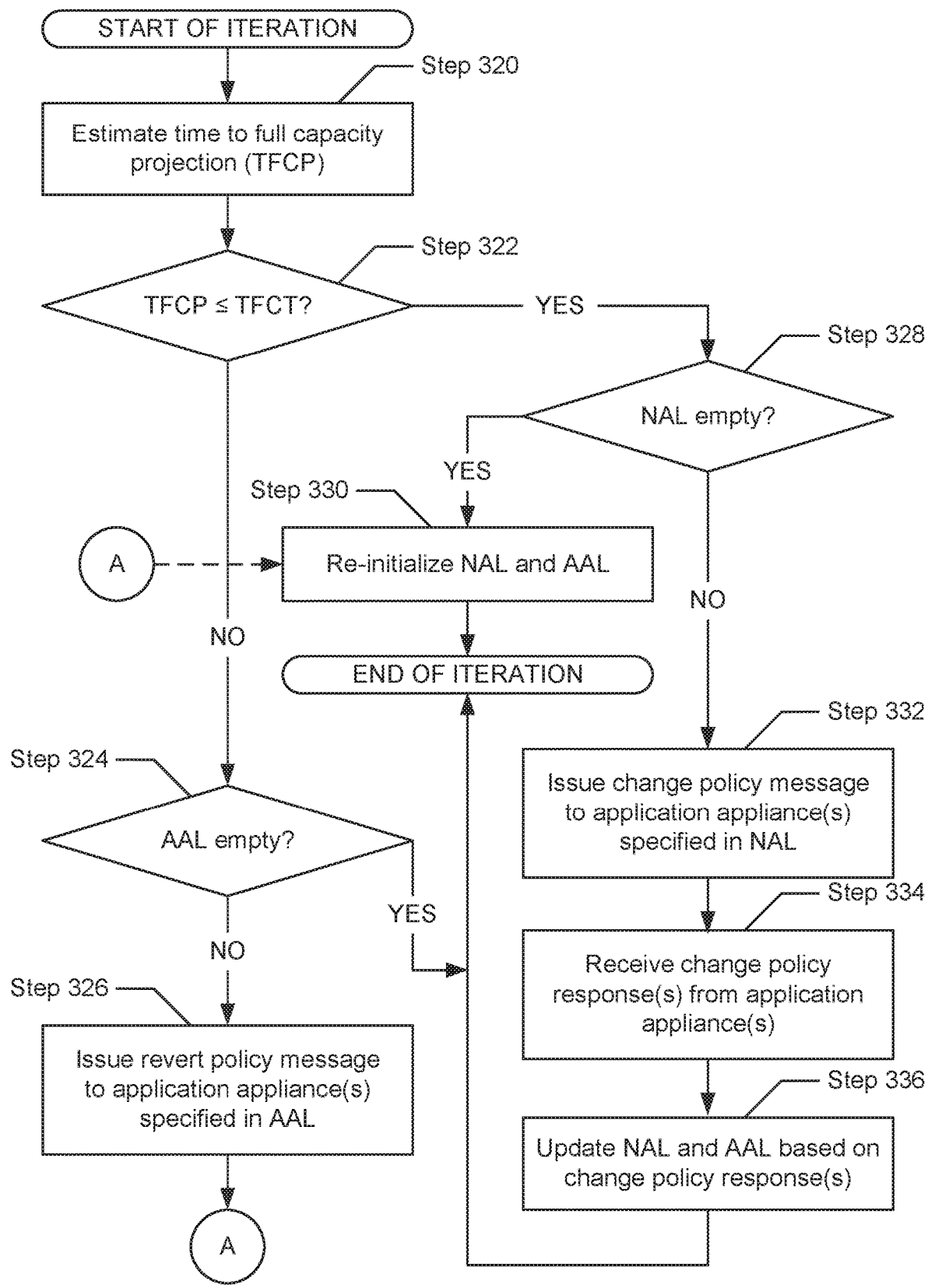

FIGS. 3A and 3B show flowcharts describing a method for optimizing backup storage space utilization in accordance with one or more embodiments of the invention. The various steps outlined below may be substantively performed by the policy handshaking agent (PHA) executing on the backup storage system (BSS) (see e.g., FIG. 2C). Further, while the various steps in the flowcharts are presented and described sequentially, one of ordinary skill will appreciate that some or all steps may be executed in different orders, may be combined or omitted, and some or all steps may be executed in parallel.

Turning to FIG. 3A, in Step 300, a non-acknowledged appliances list (NAL) is initialized. In one embodiment of the invention, the NAL may represent an abstract data type, a data object, or a data structure capable of retaining zero or more data values. Each data value, if any, may take form as an appliance identifier (AID) associated with an application appliance. An AID may refer to any arbitrary-length string of characters (e.g., letters, numbers, symbols, etc.) that serve to uniquely identify the respective application appliance. Specifically, the NAL may reflect from which application appliance(s) have a change policy response not been received following the issuance of a change policy message (described below)—i.e., which application appliance(s) have not yet acknowledged the change policy message. Furthermore, initialization of the NAL may entail populating the NAL to include a set of AIDs, where each AID of the set of AIDs reference an application appliance of a set of application appliances, respectively, that may be operatively connected and/or utilizing the backup storage system (BSS) (see e.g., FIG. 1).

In Step 302, an acknowledged appliances list (AAL) is initialized. In one embodiment of the invention, the AAL may represent an abstract data type, a data object, or a data structure capable of retaining zero or more data values. Each data value, if any, may take form as an appliance identifier (AID) associated with an application appliance. An AID may refer to any arbitrary-length string of characters (e.g., letters, numbers, symbols, etc.) that server to uniquely identify the respective application appliance. Specifically, the AAL may reflect from which application appliance(s) have a change policy response been received following the issuance of a change policy message (described below)—i.e., which application appliance(s) have acknowledged the change policy message. Furthermore, initialization of the AAL may entail populating the AAL to include an empty set of AIDs.

In Step 304, a time to full capacity threshold (TFCT) is identified. In one embodiment of the invention, the TFCT may represent a value, reflecting a programmable length of time, which when satisfied or met, triggers the dynamic backup policy handshaking between the BSS and the one or more application appliances (see e.g., FIG. 1) in accordance with embodiments of the invention. Further, the TFCT may be programmed into a predetermined in-memory address on the BSS, and by administrators of the BSS. By way of an example, the TFCT may reflect a length of time value of two months; however, one of ordinary skill will appreciate that the TFCT may reflect any granularity of time.

In Step 306, an iteration time period (ITP) is initialized and periodically elapses. In one embodiment of the invention, the ITP may represent a programmable time interval, which may reflect a periodicity associated with the generation of a time to full capacity projection (TFCP) (described below). Further, the exercising of dynamic backup policy handshaking may or may not transpire within each ITP based on the triggering condition (also described below).

The processes occurring at the onset of each ITP is described in detail below with respect to FIG. 3B.

Turning to FIG. 3B, in Step 320, a TFCP is estimated or obtained. In one embodiment of the invention, the TFCP may represent a prediction reflective of a length of time remaining until the BSS reaches full storage capacity. The TFCP may be determined through the employment of one or more forecasting and/or predictive analysis techniques, which may rely on various storage space pertinent factors (e.g., storage consumption rate, etc.). By way of an example, determination of the TFCP may entail applying a higher-order fuzzy time series (HOFTS) predictive analysis algorithm, which is described in further detail in U.S. application Ser. No. 15/960,665, filed on Apr. 24, 2018, and is incorporated herein by reference in entirety.

In Step 322, a determination is made as to whether the TFCP (estimated/obtained in Step 320) is less than or equal to the TFCT (identified in Step 304). In one embodiment of the invention, if it is determined that the TFCP is indeed less than or equal to the TFCT, then the process may proceed to Step 328. On the other hand, in another embodiment of the invention, if it is alternatively determined that the TFCP exceeds (or is greater than) the TFCT, then the process may alternatively proceed to Step 324.

In Step 324, after determining (in Step 322) that the TFCP (estimated/obtained in Step 320) is greater than the TFCT (identified in Step 304), a determination is made as to whether the AAL (initialized in Step 302, updated in Step 336 (described below), or re-initialized in Step 330 (described below)) is empty—i.e., reflects an empty set of AIDs. Accordingly, in one embodiment of the invention, if it is determined that the AAL is representative of an empty set, then the process ends (at least for the current ITP). On the other hand, in another embodiment of the invention, if it is alternatively determined that the AAL includes at least one AID, then the process may proceed to Step 326.

In Step 326, after determining (in Step 324) that the AAL includes at least one AID, a revert policy message is issued. In one embodiment of the invention, the revert policy message may be issued to the respective application appliance associated with each AID of the at least one AID specified in the AAL. For example, should the AAL include a first AID associated with a first application appliance and a second AID associated with a second application appliance, the revert policy message may be issued to both the first and second application appliances. The first and second application appliances, at least in this non-limiting example, may encompass the application appliances that have acknowledged (or responded to) a previously issued change policy message (described below). Furthermore, the revert policy message may represent a notice informing the recipient application appliance(s) that the reversion of changes, if any, made to their respective data protection policies (DPPs), to a prior state may be allowed. Changes made to the DPPs are described in further detail below. Hereinafter, following the issuance of the revert policy message, the process may proceed to Step 330.

In Step 328, after alternatively determining (in Step 322) that the TFCP (estimated/obtained in Step 320) is less than or equal to the TFCT (identified in Step 304), a determination is made as to whether the NAL (initialized in Step 300, updated in Step 336 (described below), or re-initialized in Step 330 (described below)) is empty—i.e., reflects an empty set of AIDS. Accordingly, in one embodiment of the invention, if it is determined that the NAL is representative of an empty set, then the process may proceed to Step 330. On the other hand, in another embodiment of the invention, if it is alternatively determined that the NAL includes at least one AID, then the process may alternatively proceed to Step 332.

In Step 330, after determining (in Step 328) that the NAL is empty, or after issuing the revert policy message (in Step 326), the NAL and the AAL are re-initialized. In one embodiment of the invention, re-initialization of the NAL may entail populating the NAL to include a set of AIDs, where each AID of the set of AIDs reference an application appliance of a set of application appliances, respectively, that may be operatively connected and/or utilizing the backup storage system (BSS). Meanwhile, re-initialization of the AAL may entail populating the AAL to include an empty set of AIDs. Hereinafter, following the re-initialization of the NAL and the AAL, the process ends (at least for the current ITP).

In Step 332, after alternatively determining (in Step 328) that the NAL includes at least one AID, a change policy message is issued. In one embodiment of the invention, the change policy message may be issued to the respective application appliance associated with each AID of the at least one AID specified in the NAL. For example, should the NAL include a first AID associated with a first application appliance and a second AID associated with a second application appliance, the change policy message may be issued to both the first and second application appliances. The first and second application appliances, at least in this non-limiting example, may encompass the application appliances that have yet to acknowledge (or yet to respond to) a previously issued change policy message (if one had previously been issued during a previous ITP). Furthermore, the change policy message may represent a recommendation suggesting that the recipient application appliance(s) change their respective DPPs, which effect data backup operations on the application appliance(s).

In one embodiment of the invention, upon receipt of a change policy message, a recipient application appliance may opt (or may not opt) to adjust their respective DPPs. Whether or not a recipient application appliance opts to adjust their respective DPPs may be determined based on a criticality of the data source data residing on the recipient application appliance. Data criticality may refer to a measure or reflection of how vital certain data is to the operation of programs and/or processes executing on an application appliance. By way of examples, data may be categorized as: (a) non-critical data, where, should the data be unrecoverable or unreadily accessible, application appliance operations would suffer little to no short-term impact; (b) critical data, where, should the data be unrecoverable or unreadily accessible, application appliance operations would suffer moderate short-term impact; or (c) mission critical data, where, should the data be unrecoverable or unreadily available, application appliance operations would suffer significant short-term or possible long-term impact.

In one embodiment of the invention, adjustment of the respective DPPs, if opted, may entail shifting one or more data sources, assigned to higher ranked data protection tiers, to lower ranked data protection tiers (see e.g., FIG. 2B). As mentioned above, higher ranked data protection tiers tend to provide a level of service that consumes more storage space in the backup storage system (BSS). This may be the case because of various factors associated with higher data protection service—e.g., more backup periodicity, longer data retention, full versus incremental data replication, etc. Accordingly, by "downgrading" (or temporarily reassigning) data sources from higher ranked data protection tiers to lower ranked data protection tiers, the consumption rate, at which storage space is consumed in the BSS, drops. In lowering the storage space consumption rate, even temporarily, utilization of the remaining, available storage space may be optimized and the utility of the BSS may be prolonged until other more permanent solutions (e.g., the migration of some stored data to other secondary BSSs to alleviate BSS capacity, the integration of additional storage devices to supplement BSS capacity, etc.) take effect.

In Step 334, following the issuance of the change policy message, zero or more change policy responses is/are received. In one embodiment of the invention, each change policy response, if any, may be received from one of the at least one application appliance(s) to which the change policy message (in Step 332) had been issued. Further, each change policy response, if any, may represent an acknowledgement, by a respective application appliance, of the receipt of the change policy message that had previously been issued.

In Step 336, the NAL and the AAL are updated based on the change policy response(s), if any, had been received (in Step 334). In one embodiment of the invention, for each received change policy response, a respective application appliance, whom had submitted the change policy response, may be identified. Subsequently, the AID, associated with the identified application appliance, may be identified. Thereafter, the identified AID may be: (a) removed from the NAL; and (b) added to the AAL. In substantively transferring the identified AID from the NAL to the AAL, the identified application appliance is re-classified as an application appliance that has acknowledged the change policy message (issued in Step 332). Hereinafter, following the updating of the NAL and the AAL, the process ends (at least for the current ITP).

Figure 4:
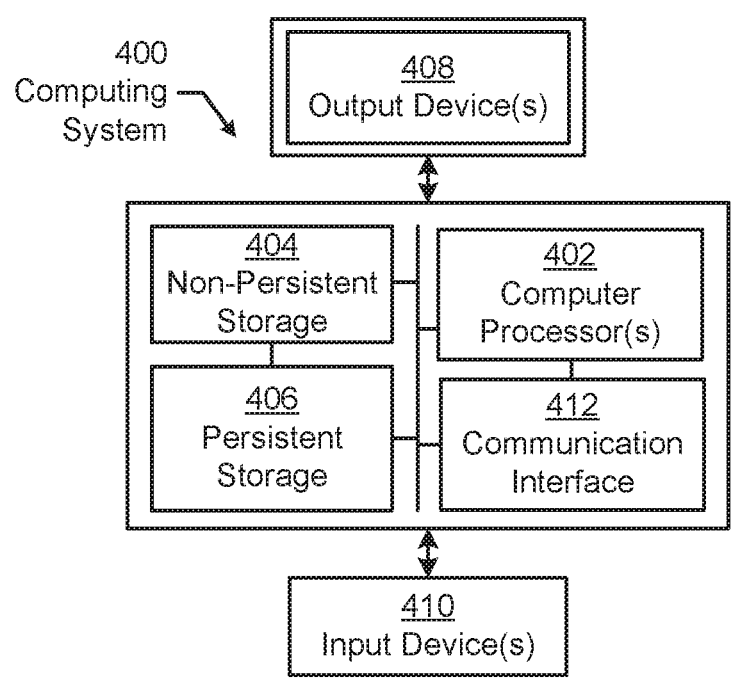
FIG. 4 shows a computing system in accordance with one or more embodiments of the invention.

FIG. 4 shows a computing system in accordance with one or more embodiments of the invention. The computing system (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing system (400) may also include one or more input devices (410), such as a touchscreen, keyboard, mouse, microphone, touchpad, electronic pen, or any other type of input device. Further, the communication interface (412) may include an integrated circuit for connecting the computing system (400) to a network (not shown) (e.g., a local area network (LAN), a wide area network (WAN) such as the Internet, mobile network, or any other type of network) and/or to another device, such as another computing device.

In one embodiment of the invention, the computing system (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the invention.

FIGS. 5A-5F show an example scenario in accordance with one or more embodiments of the invention. The following example scenario, presented in conjunction with components shown in FIGS. 5A-5F, is for explanatory purposes only and not intended to limit the scope of the invention.

Turning to FIG. 5A, an example system (500) is portrayed, which includes four application appliances (502A-502D), each operatively connected to a backup storage system (BSS) (504). Each application appliance (502A-502D) may include different internal data sources and/or operatively connect with different external data sources (not shown) (see e.g., FIG. 2A). Further, each application appliance (502A-502D), through the respective data backup agent (DBA) (not shown) executing thereon, may or may not provide the same tiers of data protection (see e.g., FIG. 2B) to data source data pertaining to the data sources hosted thereon or remotely.

Figure 5B:
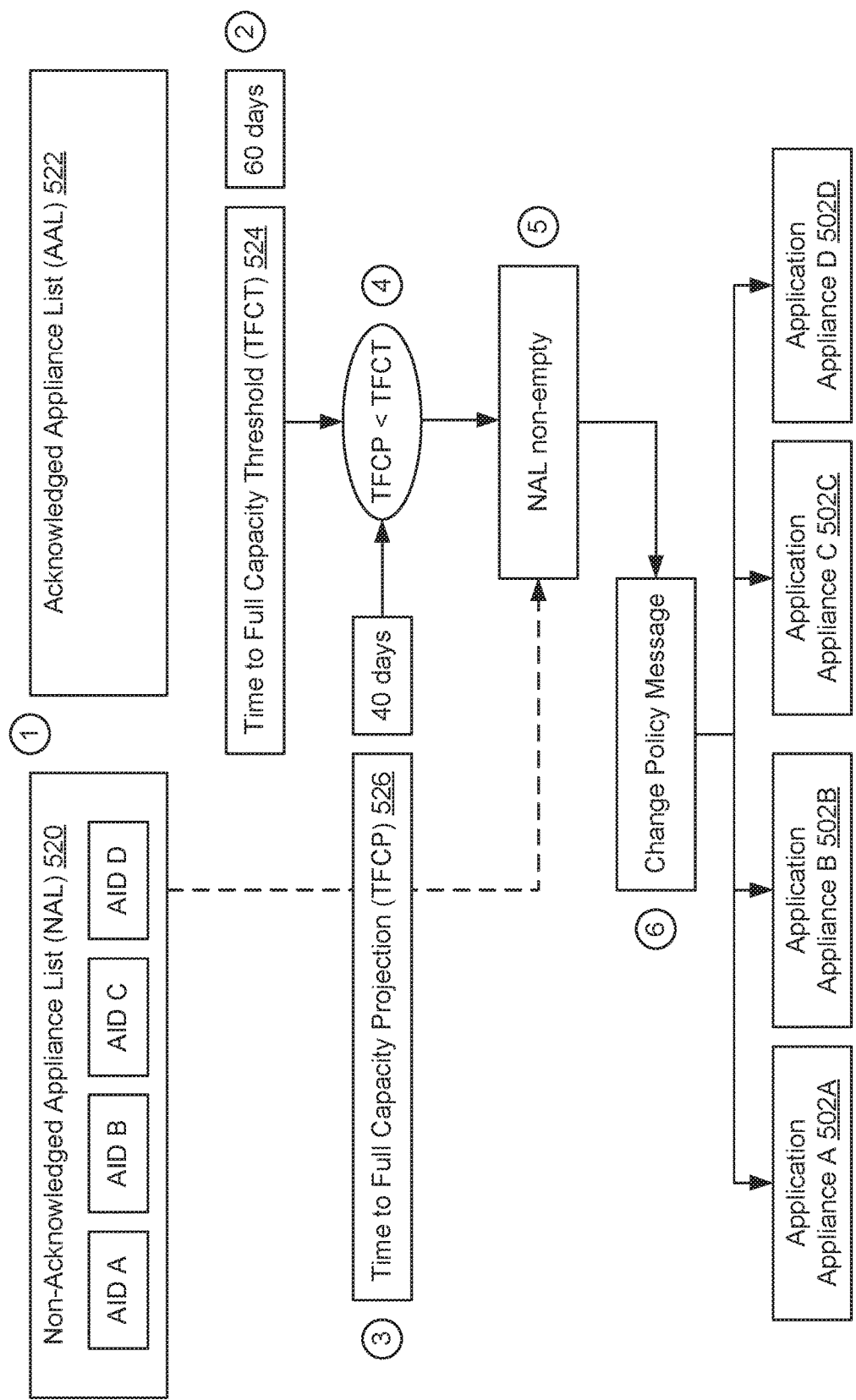

Proceeding with the example scenario, turning to FIG. 5B, consider that the policy handshaking agent (PHA) on the BSS (504) (see e.g., FIG. 2C) is monitoring storage space usage on the BSS (504). During a first iteration time period (ITP) and as an initial matter, (1) the PHA on the BSS (504) initializes a non-acknowledged appliance list (NAL) (520) and an acknowledged appliance list (AAL) (522). In initializing the NAL (520), an appliance identifier (AID) for each of the above-mentioned four application appliances (502A-502D) is included therein, whereas an empty set is used to initialize the AAL (522). Thereafter, (2) a time to full capacity threshold (TFCT) (524) is identified—i.e., 60 days—reflecting a length of time, which when satisfied or met, triggers the dynamic backup policy handshaking between the BSS (504) and the various application appliances (502A-502D).

Next, (3) the PHA on the BSS (504) obtains a time to full capacity projection (TFCP) (526)—i.e., 40 days—which may be determined by the capacity forecasting agent (CFA) also executing on the BSS (504). Subsequently, (4) the TFCT (524) and the TFCP (526) are compared, and it is determined that the TFCP (526) (i.e., 40 days) falls short of the TFCT (524) (i.e., 60 days). Based on this determination, (5) the status of the NAL (520) is assessed to determine that the NAL (520) is non-empty—i.e., all four AIDs are still retained therein. Further, because the NAL (520) is non-empty, (6) a change policy message is subsequently issued from the PHA on the BSS (504) to a counterpart PHA on each of the application appliances (see e.g., FIG. 2A) identified in the NAL (520)—i.e., all four application appliances (502A-502D).

Figure 5C:
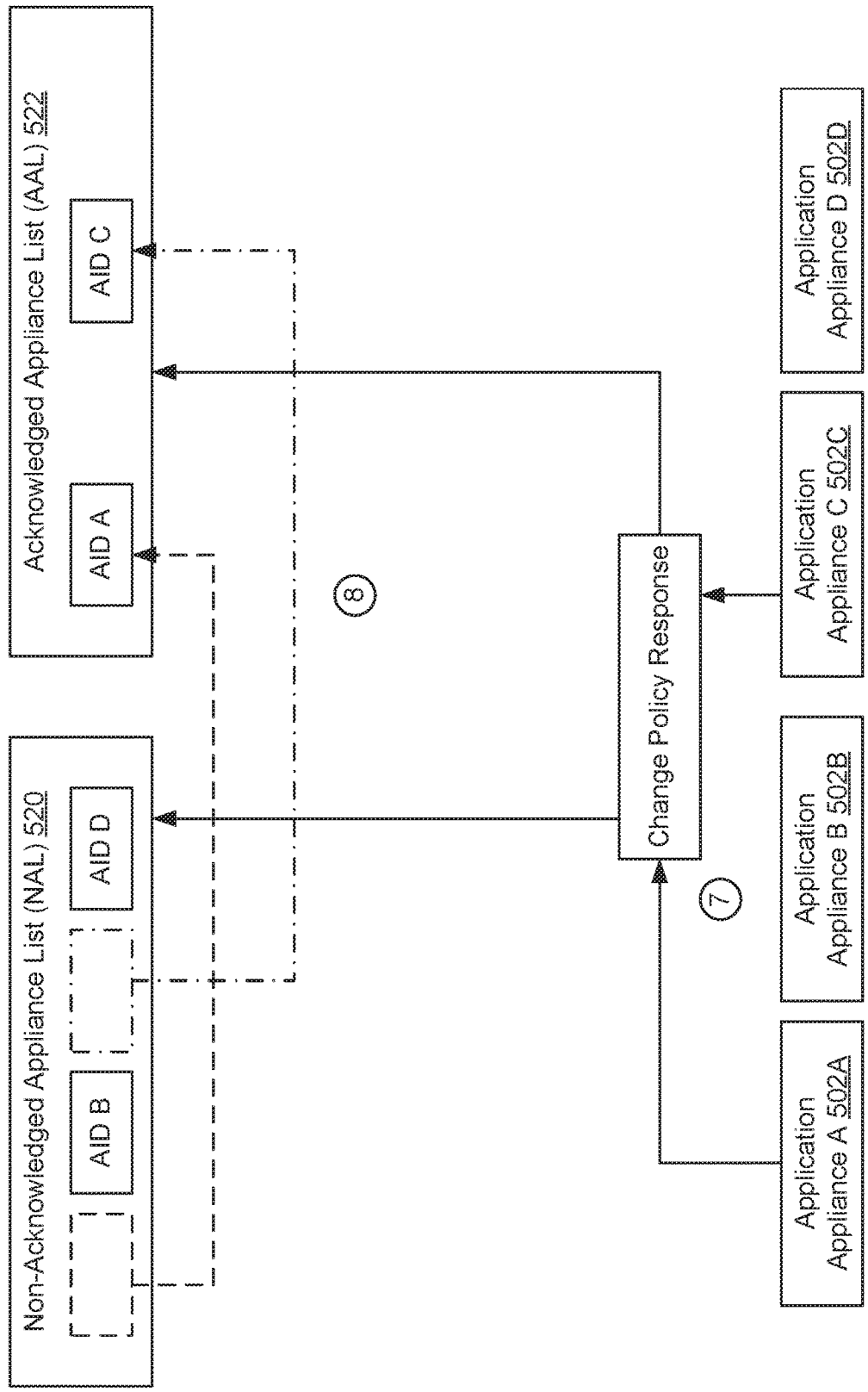

Turning to FIG. 5C, following the issuance of the change policy message, (7) a change policy response is received from some, but not all, application appliances—i.e., the first and third application appliance (502A, 502C). Each received change policy response (not shown) may reflect that a respective PHA on an application appliance had: (a) received the change policy message; (b) adjusted data source assignments to data protection tiers supported on the application appliance or, alternatively, made no adjustments, based on the criticality of the data source data maintained thereon; and (c) issued a change policy response that acknowledged receipt and consideration of the change policy message. Based on receiving a change policy response from the first and third application appliances (502A, 502C), (8) the PHA on the BSS (504) migrates the corresponding AIDs—i.e., AID A and AID C—associated with the first and third application appliances (502A, 502C) from the NAL (520) to the AAL (522).

Figure 5D:
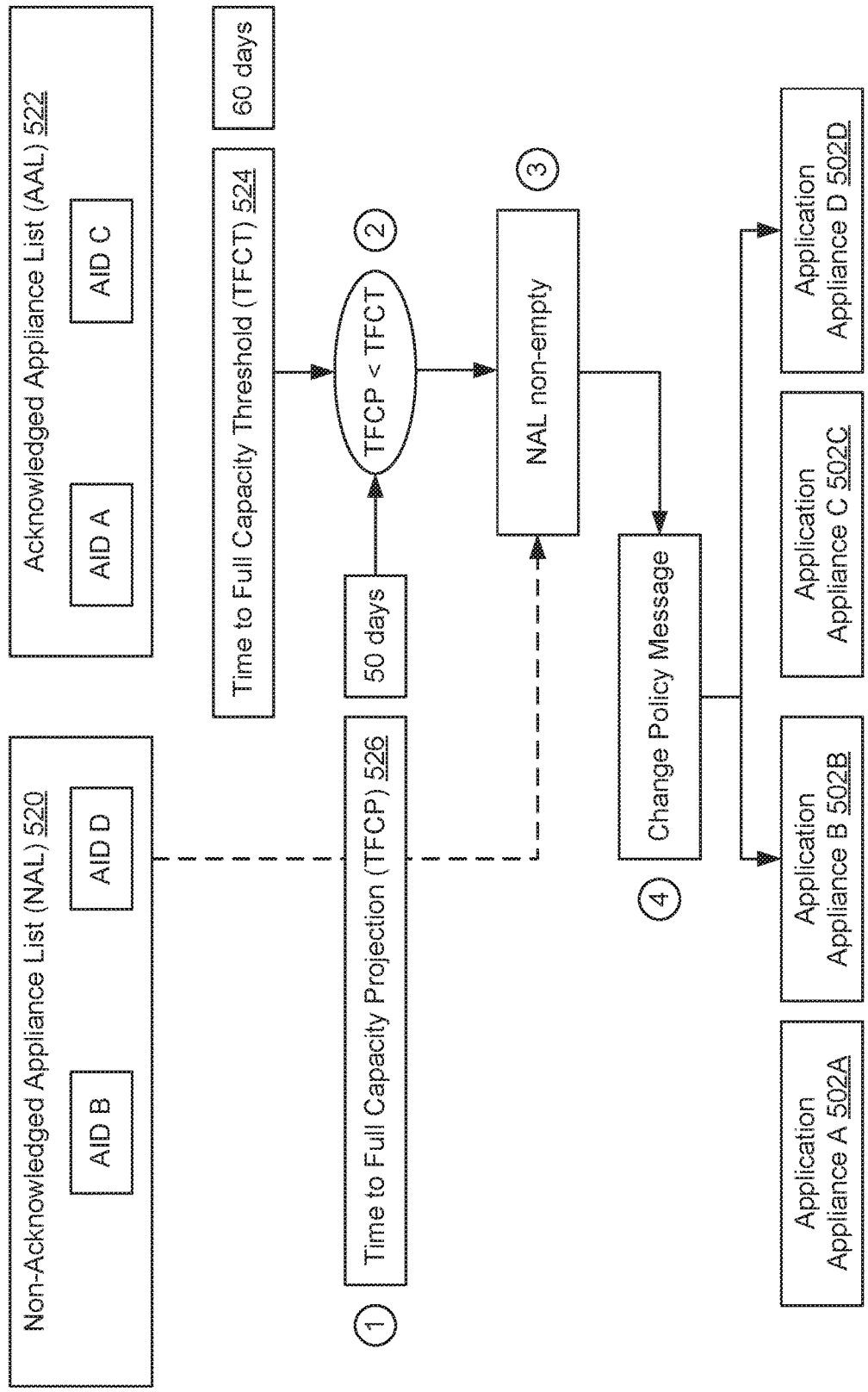

During a second ITP, turning to FIG. 5D, (1) the PHA on the BSS (504) obtains another TFCP (526)—i.e., 50 days—from the CFA also executing on the BSS (504). Since the first ITP, note that the TFCP (526) has extended from 40 days to 50 days, thereby indicating that adjustments to the data protection policies (DPP) on the first application appliance and/or third application appliance (from which change policy responses had been received during the first ITP) has slowed the consumption of storage space on the BSS (504). Afterwards, (2) the new TFCP (526) is compared against the TFCT (524) obtained in the first ITP, resulting in a determination that the new TFCP (526) (i.e., 50 days) still falls short of the TFCT (524) (i.e., 60 days). Based on the aforementioned determination, (3) the status of the NAL (520) is re-assessed, and found to be non-empty—i.e., the AIDs of the second and fourth application appliances (502B, 502D) are still retain therein. Because the NAL (520) is non-empty, (4) another change policy message is issued to any application appliances identified in the NAL (520).

Figure 5E:
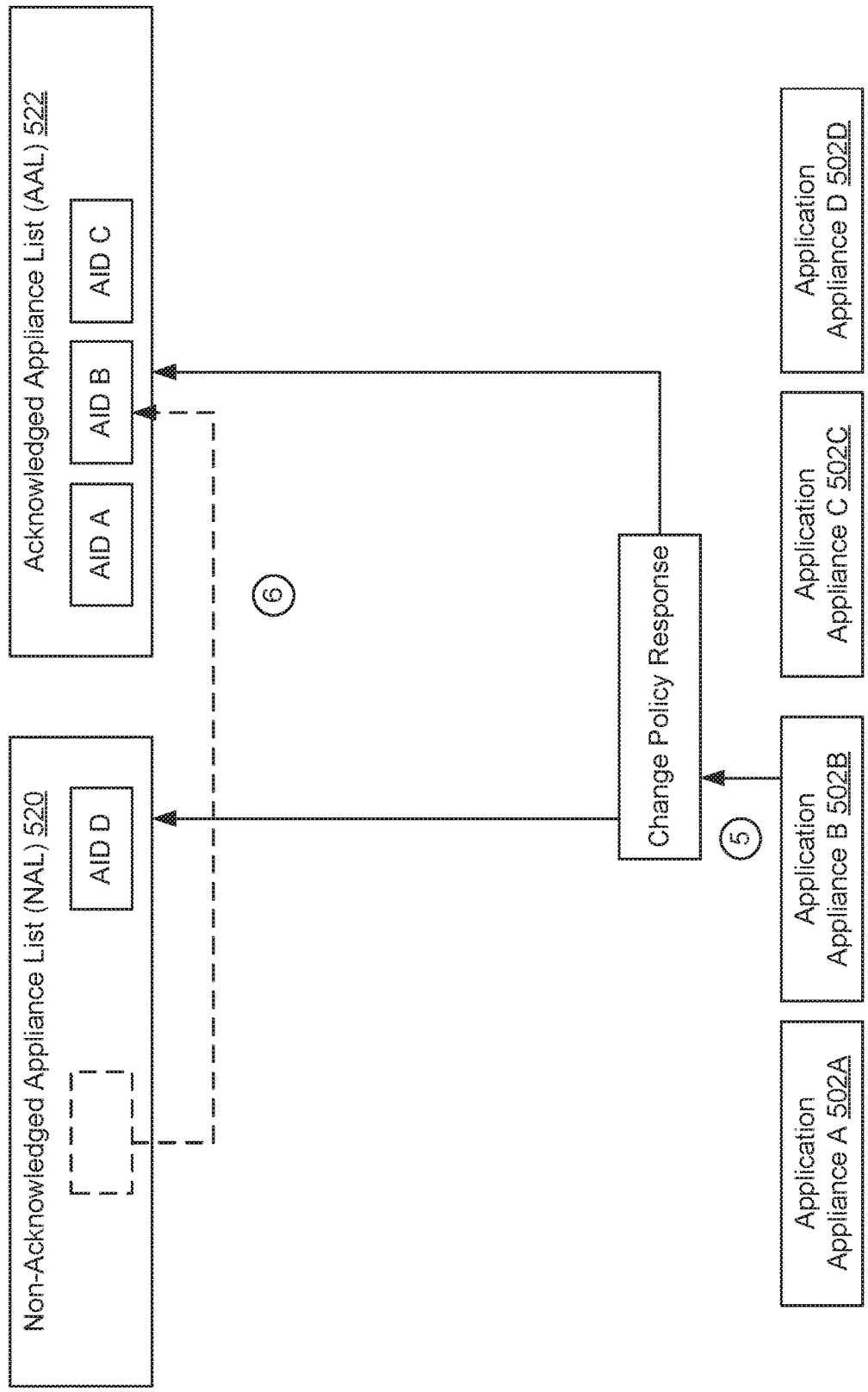

Turning to FIG. 5E, following the issuance of the above-mentioned second change policy message to the second and fourth application appliances (502B, 502D), (5) a change policy response is subsequently received back only from the second application appliance (502B). The received change policy response (not shown) may reflect that the PHA on the second application appliance (502B) had: (a) received the second change policy message; (b) adjusted data source assignments to data protection tiers supported on the second application appliance or, alternatively, made no adjustments, based on the criticality of the data source data maintained thereon; and (c) issued a change policy response that acknowledged receipt and consideration of the second change policy message. Based on receiving a change policy response from the second application appliances (502B), (6) the PHA on the BSS (504) migrates the corresponding AID—i.e., AID B—associated with the second application appliance (502B) from the NAL (520) to the AAL (522).

Figure 5F:
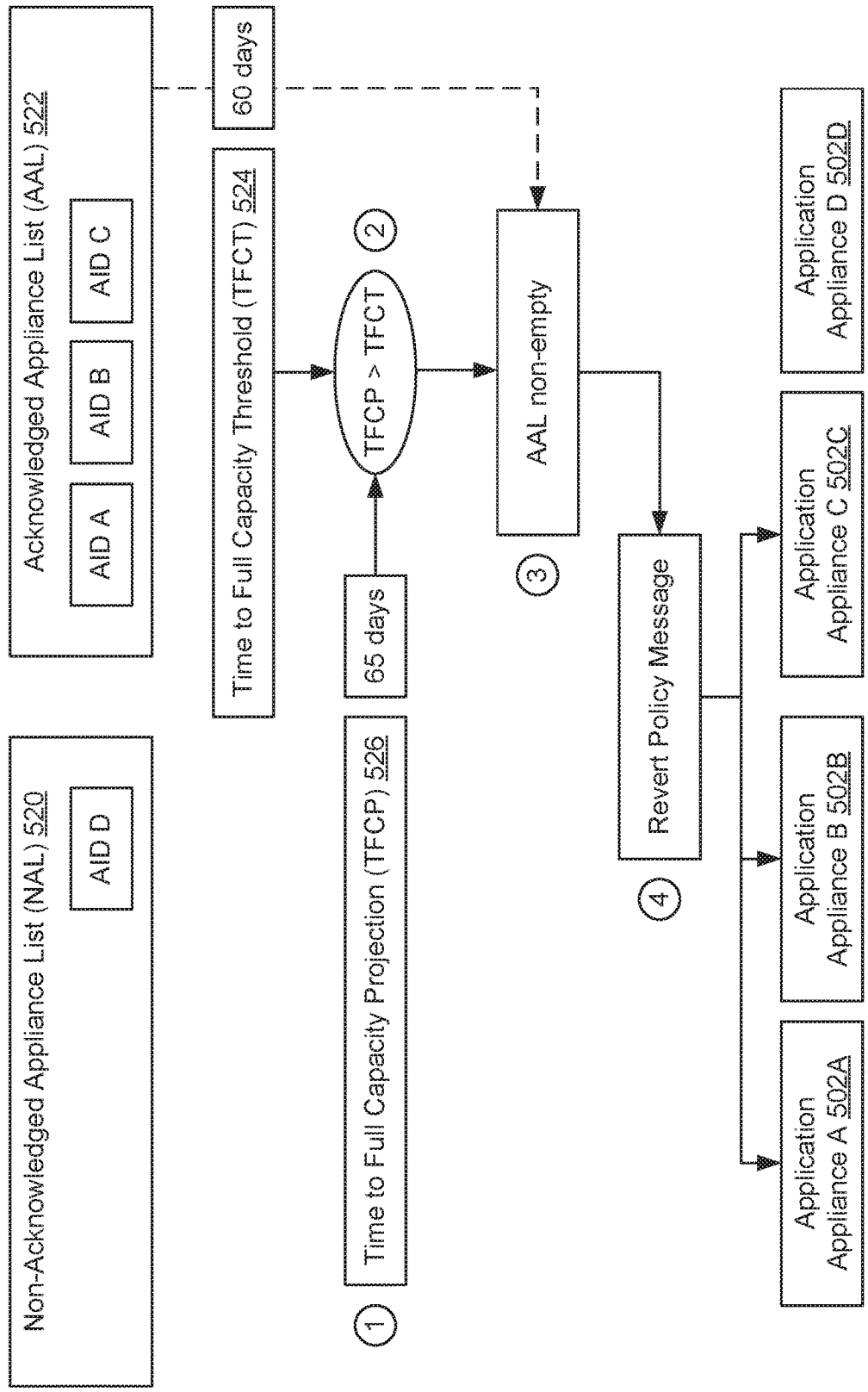

Thereafter, turning to FIG. 5F and during a third ITP, (1) the PHA on the BSS (504) obtains yet another TFCP (526)—i.e., 65 days—from the CFA. Again, note that the TFCP (526), since the second ITP, has extended further from 50 days to 65 days. The extension may indicate a reduction in the rate of storage space consumption on the BSS (504), which may have been brought about by DPP changes on the first application appliance (502A), the second application appliance (502B), the third application appliance (502C), or any combination thereof. Next, (2) the TFCP (526) is compared against the TFCT (524), and this time, it is determined that the TFCP (526) (i.e., 65 days) exceeds the TFCT (524) (i.e., 60 days).

Subsequently, based on the above-mentioned determination, (3) a status of the AAL (522) is instead identified, thereby indicating that the AAL (522) is non-empty—i.e., thus retaining the AIDs for the first, second, and third application appliances (502A-502C). Further, because the AAL (522) is non-empty, (4) a revert policy message is issued. Specifically, the revert policy message is issued from the PHA on the BSS (504) to a counterpart PHA on each application appliance identified in the AAL (522). Upon receipt of the revert policy message, the PHA on a given application appliance may: (a) undo any DPP changes performed in consideration of the first or second change policy message; or (b) disregard the revert policy message had no adjustments been performed.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for optimizing storage space utilization, comprising:
    initializing a non-acknowledged appliances list (NAL) and an acknowledged appliances list (AAL);
    identifying a time to full capacity threshold (TFCT) for a physical storage array (PSA);
    estimating a first time to full capacity projection (TFCP) for the PSA;
    making a first determination that the first TFCP is below the TFCT; and
    based on the first determination:
        issuing a change policy message to each application appliance of a set of application appliances utilizing the PSA,
        wherein the change policy message results in changes to data protection policies on at least a subset of the set of application appliances, to optimize a utilization of available storage space on the PSA.

2. The method of claim 1, wherein the NAL, when initialized, comprises a set of appliance identifiers (AIDs), wherein each AID in the set of AIDs identifies a different application appliance in the set of application appliances.

3. The method of claim 1, wherein the AAL, when initialized, comprises an empty set.

4. The method of claim 1, wherein the first TFCP is estimated using a higher-order fuzzy time-series (HOFTS) capacity forecasting model.

5. The method of claim 1, further comprising:
    receiving a change policy response from each application appliance of the subset of the set of application appliances utilizing the PSA;
    updating the NAL by removing a subset of a set of appliance identifiers (AIDs) specified therein, to obtain an updated NAL; and
    updating the AAL by introducing the subset of the set of AIDs thereto, to obtain an updated AAL,
    wherein each AID in the subset of the set of AIDs identifies a different application appliance in the subset of the set of application appliances utilizing the PSA.

6. The method of claim 5, further comprising:
    estimating a second TFCP for the PSA;
    making a second determination that the second TFCP is below the TFCT;
    making a third determination, based on the second determination, that the updated NAL is non-empty set; and
    based on the third determination:

issuing the change policy message to each application appliance identified by an AID specified in the updated NAL.

7. The method of claim 5, further comprising:
estimating a second TFCP for the PSA;
making a second determination that the second TFCP is below the TFCT;
making a third determination, based on the second determination, that the updated NAL is an empty set; and
based on the third determination:
re-initializing the updated NAL and the updated AAL, to obtain the NAL and the AAL.

8. The method of claim 5, further comprising:
estimating a second TFCP for the PSA;
making a second determination that the second TFCP exceeds the TFCT;
making a third determination, based on the second determination, that the updated AAL is a non-empty set;
based on the third determination:
issuing a revert policy message to each application appliance identified by an AID specified in the updated AAL; and
re-initializing the updated NAL and the updated AAL, to obtain the NAL and the AAL.

9. A system, comprising:
a plurality of application appliances;
a computer processor operatively connected to the plurality of application appliances and a physical storage array (PSA); and
a first policy handshaking agent (PHA) executing on the computer processor, and programmed to:
initialize a non-acknowledged appliances list (NAL) and an acknowledged appliances list (AAL);
identify a time to full capacity threshold (TFCT) for the PSA;
obtain a first time to full capacity projection (TFCP) for the PSA;
make a first determination that the first TFCP is below the TFCT; and
based on the first determination:
issue a change policy message to each application appliance of the plurality of application appliances utilizing the PSA,
wherein the change policy message results in changes to data protection policies on at least a subset of the set of application appliances, to optimize a utilization of available storage space on the PSA.

10. The system of claim 9, further comprising:
a capacity forecasting agent (CFA) executing on the computer processor, and operatively connected to the first PHA,
wherein the CFA is programmed to:
estimate the first TFCP for the PSA using a higher-order fuzzy time-series (HOFTS) capacity forecasting model; and
provide the first TFCP to the first PHA.

11. The system of claim 10, further comprising:
a backup storage system (BSS) comprising the computer processor, the PSA, the first PHA, and the CFA.

12. The system of claim 9, wherein each application appliance of the plurality of application appliances comprises a second PHA executing on a second computer processor thereon, wherein the second PHA communicates with the first PHA and performs changes to the data protection policies to optimize the utilization of available storage space on the PSA.

13. A non-transitory computer readable medium (CRM) comprising computer readable program code, which when executed by a computer processor, enables the computer processor to:
initialize a non-acknowledged appliances list (NAL) and an acknowledged appliances list (AAL);
identify a time to full capacity threshold (TFCT) for a physical storage array (PSA);
estimate a first time to full capacity projection (TFCP) for the PSA;
make a first determination that the first TFCP is below the TFCT; and
based on the first determination:
issue a change policy message to each application appliance of a set of application appliances utilizing the PSA,
wherein the change policy message results in changes to data protection policies on at least a subset of the set of application appliances, to optimize a utilization of available storage space on the PSA.

14. The non-transitory CRM of claim 13, wherein the NAL, when initialized, comprises a set of appliance identifiers (AIDs), wherein each AID in the set of AIDs identifies a different application appliance in the set of application appliances.

15. The non-transitory CRM of claim 13, wherein the AAL, when initialized, comprises an empty set.

16. The non-transitory CRM of claim 13, wherein the first TFCP is estimated using a higher-order fuzzy time-series (HOFTS) capacity forecasting model.

17. The non-transitory CRM of claim 13, comprising computer readable program code, which when executed by the computer processor, further enables the computer processor to:
receive a change policy response from each application appliance of the subset of the set of application appliances utilizing the PSA;
update the NAL by removing a subset of a set of appliance identifiers (AIDs) specified therein, to obtain an updated NAL; and
update the AAL by introducing the subset of the set of AIDs thereto, to obtain an updated AAL,
wherein each AID in the subset of the set of AIDs identifies a different application appliance in the subset of the set of application appliances utilizing the PSA.

18. The non-transitory CRM of claim 17, comprising computer readable program code, which when executed by the computer processor, further enables the computer processor to:
estimate a second TFCP for the PSA;
make a second determination that the second TFCP is below the TFCT;
make a third determination, based on the second determination, that the updated NAL is non-empty set; and
based on the third determination:
issue the change policy message to each application appliance identified by an AID specified in the updated NAL.

19. The non-transitory CRM of claim 17, comprising computer readable program code, which when executed by the computer processor, further enables the computer processor to:
estimate a second TFCP for the PSA;
make a second determination that the second TFCP is below the TFCT;
make a third determination, based on the second determination, that the updated NAL is an empty set; and based on the third determination:
   re-initialize the updated NAL and the updated AAL, to obtain the NAL and the AAL.

20. The non-transitory CRM of claim 17, comprising computer readable program code, which when executed by the computer processor, further enables the computer processor to:
- estimate a second TFCP for the PSA;
- make a second determination that the second TFCP exceeds the TFCT;
- make a third determination, based on the second determination, that the updated AAL is a non-empty set;
- based on the third determination:
  - issue a revert policy message to each application appliance identified by an AID specified in the updated AAL; and
  - re-initialize the updated NAL and the updated AAL, to obtain the NAL and the AAL.

\* \* \* \* \*